United States Patent [19]

Bull

[11] Patent Number: 5,300,885
[45] Date of Patent: Apr. 5, 1994

[54] FIELD PROBE FOR MEASURING VECTOR COMPONENTS OF AN ELECTROMAGNETIC FIELD

[75] Inventor: Jeffrey F. Bull, Chalfont, Pa.

[73] Assignee: Flam & Russell, Inc., Horsham, Pa.

[21] Appl. No.: 893,739

[22] Filed: Jun. 5, 1992

[51] Int. Cl.[5] .................... G01R 33/02; G01R 29/06
[52] U.S. Cl. .................... 324/247; 324/260; 324/262; 324/72; 343/726
[58] Field of Search ............ 324/244, 1, 247, 260-262, 324/72; 343/725-727, 793, 794, 810, 893, 865, 898, 907, 908

[56] References Cited

U.S. PATENT DOCUMENTS

| | | | |
|---|---|---|---|
| 3,750,017 | 7/1973 | Bowman et al. | 324/247 X |
| 4,023,093 | 5/1977 | Aslan | 324/247 |
| 4,450,406 | 5/1984 | Bobb | 324/247 |
| 4,739,263 | 4/1988 | Mohri et al. | 324/247 |
| 4,812,812 | 3/1989 | Flowerdew et al. | 324/247 X |
| 5,151,649 | 9/1992 | Héroux | 324/247 X |

Primary Examiner—Gerard R. Strecker
Assistant Examiner—Warren S. Edmonds
Attorney, Agent, or Firm—Howson & Howson

[57] ABSTRACT

An electromagnetically complete field vector field probe has a set of three dipoles extending along three mutually perpendicular axes, and three loops situated in mutually orthogonal planes defined by different pairs of said axes. The dipoles and loops are all disposed about a common center. Each dipole has a central element and two end elements, separated by gaps. Each loop has four conducting elements each extending from a point adjacent to one of the three axes to a point adjacent to another of the three axes. The conducting elements of each loop are separated from one another by gaps at the axes, so that each gap of each loop is substantially coincident with a gap of another loop and with a gap of a dipole. Coaxial lines extending through the central conducting elements of the dipoles are connected directly to the ends of the loop elements and need not extend through parts of the loop elements themselves. Each loop is connected to a corresponding magnetic field output port through an additive network having eight inputs, each input being connected to a different end of an element of the loop.

17 Claims, 4 Drawing Sheets

FIELD PROBE FOR MEASURING VECTOR COMPONENTS OF AN ELECTROMAGNETIC FIELD

FIELD OF THE INVENTION

This invention relates to field probes, and in particular to an improved field probe suitable for use in various applications such as radio direction finding and in antenna pattern measurement.

BACKGROUND OF THE INVENTION

At VHF frequencies, it is possible to achieve acceptable direction finding accuracy using an interferometer comprising two dipole elements spaced from each other by one wavelength. However, at HF frequencies, i.e. frequencies in the range of approximately 2-30 Mhz., interferometry is not a practical way to achieve highly accurate direction finding, in part because the required element spacing is prohibitively large. Most other direction finding antennas usable in the HF range are comparatively inaccurate.

One type of device which is able to achieve high accuracy in the HF range is the field probe. A field probe is a device which measures one or more components of an electromagnetic field. Direction finding, by means of a field probe, is fundamentally a process of comparing amplitudes of field components, as detected by two or more antennae having different antenna patterns.

A time-varying electromagnetic field is completely characterized at any point in space, in Cartesian coordinates, by six vector quantities: the electric field parallel to the x axis ($E_x$), the electric field parallel to the y axis ($E_y$), the electric field parallel to the z axis ($E_z$), the magnetic field parallel to the x axis ($H_x$), the magnetic field parallel to the y axis ($H_y$), and the magnetic field parallel to the z axis ($H_z$).

An electromagnetically complete field probe resolves the electric and magnetic field components of an electromagnetic wave into their orthogonal components $E_x$, $E_y$, $E_z$, $H_x$, $H_y$ and $H_z$. By applying known, model-based "superresolution" algorithms to the output of the field probe, direction finding accuracies comparable to those achievable by interferometry can be realized.

Preferably, in the interest of transportability and cost, and in the interest of measurement accuracy as well, the field probe is electrically small, i.e. its element lengths and spacings are only small fraction of the wavelength of the received signal. An electrically small antenna is inefficient. However, in the HF range, external noise, rather than internal noise, is the primary noise problem. Since external noise and signal strength vary together in dependence on antenna efficiency, it is possible to compensate for the inefficiency of a small antenna by amplification, without seriously affecting the signal to noise ratio (S/N). Thus, the size of an electromagnetic field probe can be reduced until a point is reached at which there is a serious degradation in the overall signal to noise ratio. A practical probe suitable for use in the HF range can have a maximum dimension no more than approximately two meters.

One form of prior art electromagnetically complete field probe comprises a three mutually perpendicular dipoles and three mutually perpendicular loops, all symmetrical about a common center point. The dipoles measure the electric field components $E_x$, $E_y$ and $E_z$, while the loops measure the magnetic field components $H_x$, $H_y$ and $H_z$.

Each dipole is in a special configuration and comprises an intermediate conductor extending through the center of the array, and two end conductors, one on each end of the array. For example, the dipole for measuring $E_x$ has an intermediate conductor and two end conductors, all extending along the x axis. The end conductors are separated from the intermediate conductors by gaps, and electrical connections are from the gaps, through a four-port hybrid junction to an x-axis electric field ($E_x$) output port. The $E_y$ and $E_z$ dipoles are similarly constructed and connected to output ports.

The loops are situated respectively in the y-z, x-z and x-y planes. Each loop comprises four elements, each element corresponding to the side of a rectangle. Electrical connections are made to the elements at gaps formed at the corners of the rectangle. The electrical connections for each loop are made, through an array of four-port hybrid junctions to an output port. Thus the loop in the y-z plane is connected to an $H_x$ output port; the loop in the x-z plane is connected to an $H_y$ output port; the loop in the x-y plane is connected to an $H_z$ output port.

Although the electromagnetically complete field probe is used as a receiving antenna, its operation can be most easily understood by treating each dipole and loop as a transmitting antenna.

A voltage applied to the x-axis electric field port would induce a current distribution in the intermediate conductor and end conductors of the x-axis dipole. Similar voltages applied to the y-axis and z-axis electric field ports would induce current distributions in the corresponding dipoles. Thus, by the theorem of electromagnetic reciprocity, when the probe is subjected to an incident electromagnetic field, the electric field output ports provide voltages proportional to the electric field components along the axes of their corresponding dipoles.

In a similar way, a voltage applied to the x-axis magnetic field port ($H_x$) would excite voltages at the corners of the loop in the y-z plane which induce a current distribution in the elements of the loop. Likewise, a voltage applied to the y-axis magnetic field port ($H_y$) would induce a current distribution in the elements of the loop in the x-z plane, and a voltage applied to the z-axis magnetic field port ($H_z$) would induce a current distribution in the elements of the loop in the y-z plane.

The arrangement of elements in the electromagnetically complete field probe substantially eliminates the effects of mutual coupling between elements. For example, viewing the loops and dipoles of the device once more as transmitting antennae, if the loop in the x-y plane is excited, currents would be induced in elements of the x and y-axis dipoles. However, because the loop is excited at each of its corners, the current distribution in the loop is nearly balanced. Therefore, in each element of the x and y axis dipoles, currents induced by mutual coupling with the loop in the x-y plane oppose and cancel one another.

One of the problems with the prior field probe, as described above, is that it is physically difficult to connect the magnetic field ports to the corners of the three loops. Another problem is that, in the transmitting antenna model of the device, exact balancing and cancellation of induced currents is not achieved. Correspondingly, in the field probe, unbalanced conditions exist, which adversely affect the accuracy of measurement.

BRIEF SUMMARY OF THE INVENTION

The principal object of this invention is to provide an improved field probe which is physically simpler than known field probes.

Another object of this invention is to provide an improved field probe which is capable of more accurate measurement than known field probes.

The magnetic field portion of the vector field probe in accordance with the invention comprises a set of three loops having a common center and situated respectively in three mutually orthogonal planes, each plane being defined by a different pair of mutually perpendicular axes extending through the common center. Each loop comprises four conducting elements, each extending from a point adjacent to one of the three axes to a point adjacent to another of the three axes. The conducting elements of each loop are separated from one another by gaps at the axes, whereby each gap of each loop is substantially coincident with a gap of another loop.

The preferred form of the invention is an electromagnetically complete field probe having not only three loops, but three dipoles. Each dipole comprises a central conducting element extending through the common center, and two end conductors, one at each end of the central conducting element. Each end conductor is separated from the central conducting element by a gap. The gaps of the dipoles coincide with the gaps of the loops. This structure simplifies electrical connections to the ends of the loop elements, as coaxial lines extending through the central conducting elements of the dipoles can be connected directly to the ends of the loop elements without the need for the coaxial lines to extend through parts of the loop elements themselves.

In the preferred form of the invention, each loop is connected to a corresponding magnetic field output port through an additive network having eight inputs, each input being connected to a different end of an element of the loop.

Further objects, advantages and details of the invention will be apparent from the following detailed description when read in conjunction with the drawings.

DETAILED DESCRIPTION

Figure 1:
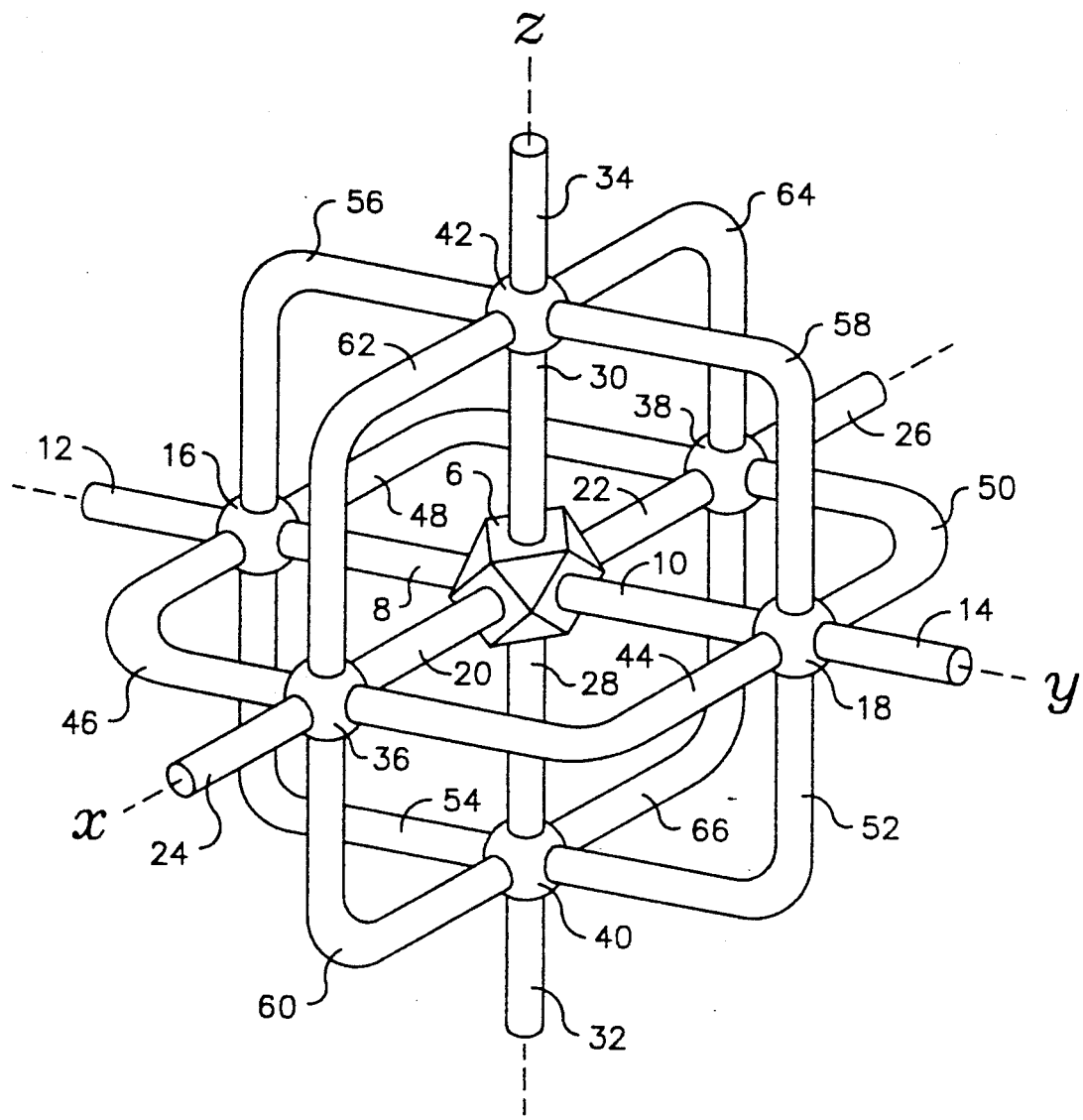
FIG. 1 is a perspective view of an electromagnetically complete field probe in accordance with the invention.

In the probe shown in FIG. 1, the x, y and z axes are labelled. At the center of the structure, there is provided a polyhedron 6, which is preferably in the form of a tetradecahedron having six square faces and eight triangular faces.

The probe comprises three mutually perpendicular dipoles aligned respectively with the x, y and z axes, and three loops, situated in planes defined respectively by different pairs of the x, y and z axes.

The y-axis dipole comprises a central conducting element consisting of the centrally located polyhedron 6 and two tubular parts 8 and 10, extending respectively from opposite square faces of polyhedron 6 along the y axis. The y-axis dipole also includes a pair of end conductors 12 and 14, both aligned with the y-axis. End conductor 12 is supported by insulator 16 at the outer end of tubular part 8, and end conductor 14 is similarly supported by an insulator 18 at the outer end of tubular part 10. By virtue of the insulators 16 and 18, there are two gaps in the y-axis dipole, one at the location of insulator 16, and another at the location of insulator 18. Coaxial transmission lines (not shown in FIG. 1) are connected to the dipole elements at these gaps.

The x-axis and z-axis dipoles are structurally identical to the y-axis dipole, and central polyhedron 6 is common to all three dipoles. The x-axis dipole comprises central polyhedron 6, tubular parts 20 and 22, and end elements 24 and 26. The z-axis dipole comprises central polyhedron 6, tubular parts 28 and 30, and end elements 32 and 34. Insulators, similar to insulators 16 and 18, are provided at 36, 38, 40 and 42.

The loops are entirely supported by the six insulators, and each comprises four conducting elements, each extending from one insulator to another. Thus, each of the four conducting elements of a loop extends from a point adjacent to one axis to a point adjacent to another axis, so that each loop has four gaps. The gaps of each loop are situated at the locations of the insulators on which the loop is supported. The loop in the x-y plane comprises four generally L-shaped conducting elements 44, 46, 48 and 50. The loop in the y-z plane similarly comprises generally L-shaped conducting elements 52, 54, 56 and 58. The loop in the x-z plane comprises generally L-shaped elements 60, 62, 64 and 66. Preferably, the loops are generally square in shape.

As will become apparent from the description to follow, the dipoles and loops are connected through electrical networks to output ports from which electrical signals corresponding to the magnitudes of the six electromagnetic field vectors can be derived.

Figure 2:
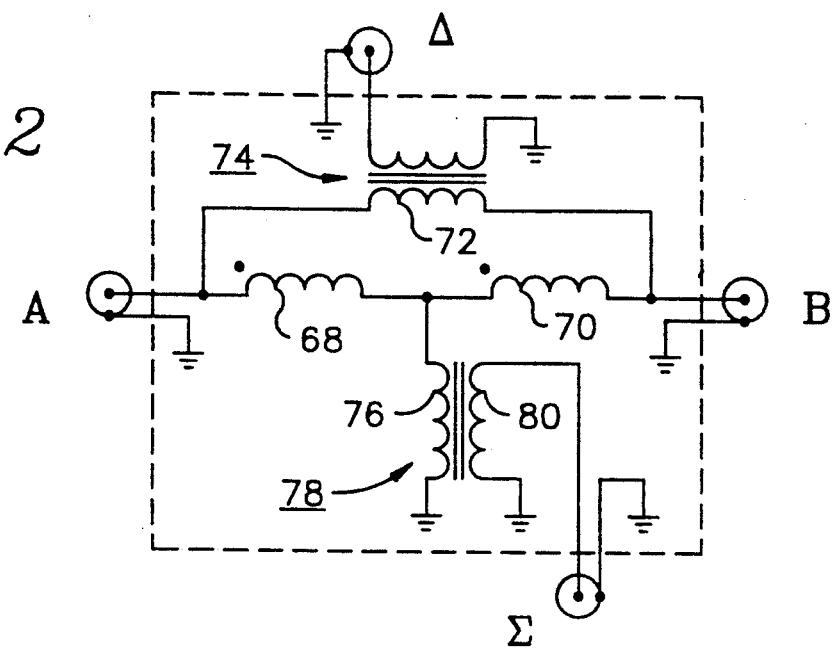
FIG. 2 is a schematic view of a four-port hybrid junction of the kind used in the field probe.

The basic building block of the networks is the four-port hybrid junction depicted in FIG. 2. The hybrid junction has four coaxial terminals, labelled respectively A, B, Σ and Δ. The center connections of the A and B terminals are connected respectively to series-connected, mutually coupled inductors 68 and 70. These center connections are also connected together through winding 72 of transformer 74, the other winding of which is connected to the Δ terminal and to a common connection indicated by the ground symbol. The junction of inductors 68 and 70 is connected to winding 76 of transformer 78, and the other winding 80 of transformer 78 is connected to the Σ terminal.

The hybrid junction shown in FIG. 2 is the low frequency analog of a similar device used in the VHF or microwave range, and implemented by waveguides or coaxial transmission lines. With the Δ terminal terminated in its characteristic impedance, an input signal at the Σ terminal is split into two components of equal magnitude and equal phase, appearing at terminals A and B. With the Σ terminal terminated in its characteristic impedance, an input signal at the Δ terminal is split into two components of equal magnitude and opposite phase, appearing at terminals A and B. Conversely, if input signals are applied to terminals A and B, and the Δ terminal is terminated in its characteristic impedance, the Σ terminal provides an output which represents the sum of the two input signals. Likewise, if input signals are applied to terminals A and B, and the Σ terminal is terminated in its characteristic impedance, the Δ terminal provides an output which represents the difference of the two input signals.

Figure 3:
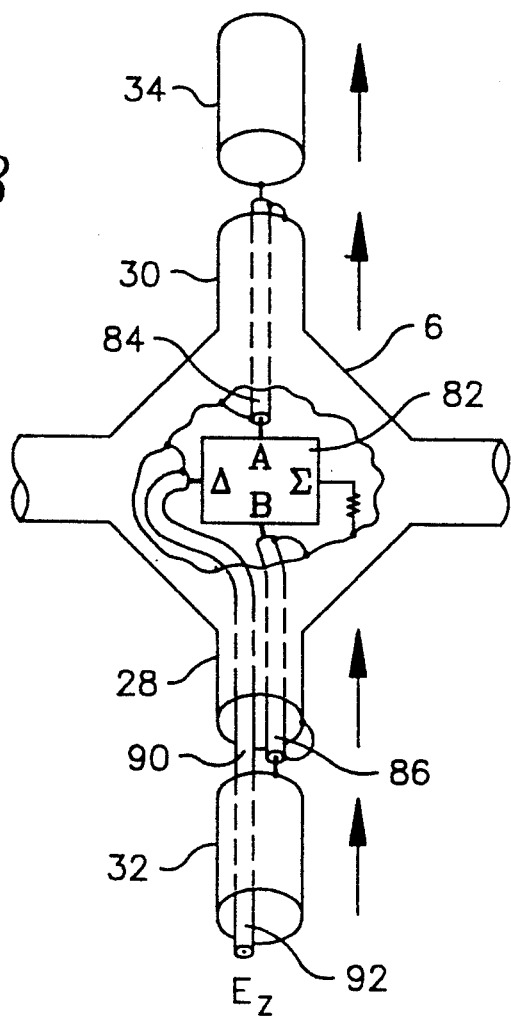
FIG 3 is a schematic perspective view showing one electric field-sensing portion of the field probe, and the electrical connections incorporated therein.

Each of the three dipoles in the field probe utilizes one hybrid junction of the kind shown in FIG. 2. As shown in FIG. 3, the z-axis dipole comprises central polyhedron 6, tubular parts 28 and 30, which are directly connected to polyhedron 6, and end elements 32 and 34. The central polyhedron 6 houses the networks which interconnect the elements of the probe with its output terminals. One network element is hybrid junction 82, which has its A terminal connected, through the center conductor of coaxial line 84, to end element 34, and its B terminal connected, through the center conductor of coaxial line 86, to end element 32. These coaxial lines extend through hollow tubular parts 28 and 30 of the central element of the dipole. The outer conductors of coaxial lines 84 and 86 are connected at one end to central polyhedron 6, and at their other ends respectively to tubular parts 30 and 28. The Σ terminal of junction 82 is connected through resistor 88 to the wall of central polyhedron 6. The resistance value of resistor 88 is equal to the characteristic impedance of the Σ terminal. The Δ terminal of junction 82 is connected through the center conductor of coaxial line 90 to a z-axis output terminal 92. Here again, the outer conductor of the coaxial line is grounded to the wall of the central polyhedron.

Matching transformers (not shown) can be provided at the dipole feed points in order to match the impedances of the dipoles to the impedances of the hybrid junctions. The transformer impedance values will, of course, depend on the impedances encountered at the feed points of the dipoles, and to the impedances of the ports of the hybrid junctions to which they are connected. In a typical implementation, 50Ω to 800Ω transformers are used.

At any instant of time, an electric field component in the z-axis will induce a current in the dipole elements in one direction, for example, in the direction of the arrows in FIG. 3. The voltages arriving at terminals A and B are 180° out of phase with each other, and therefore, the magnitudes of these voltages are effectively added together at the Δ terminal of the hybrid junction, so that the voltage appearing at $E_z$ output terminal 92 represents the magnitude of the electric field vector along the z-axis.

The x-axis and y-axis dipoles are similar to the z-axis dipole, each having a hybrid junction corresponding to junction 82, and providing $E_x$ and $E_y$ voltage outputs at output terminals corresponding to output terminal 92.

The dipole structure and electrical connections described above are substantially the same as those in the known form of electromagnetically complete field probe described above in the discussion of the background of the invention.

Figure 4:
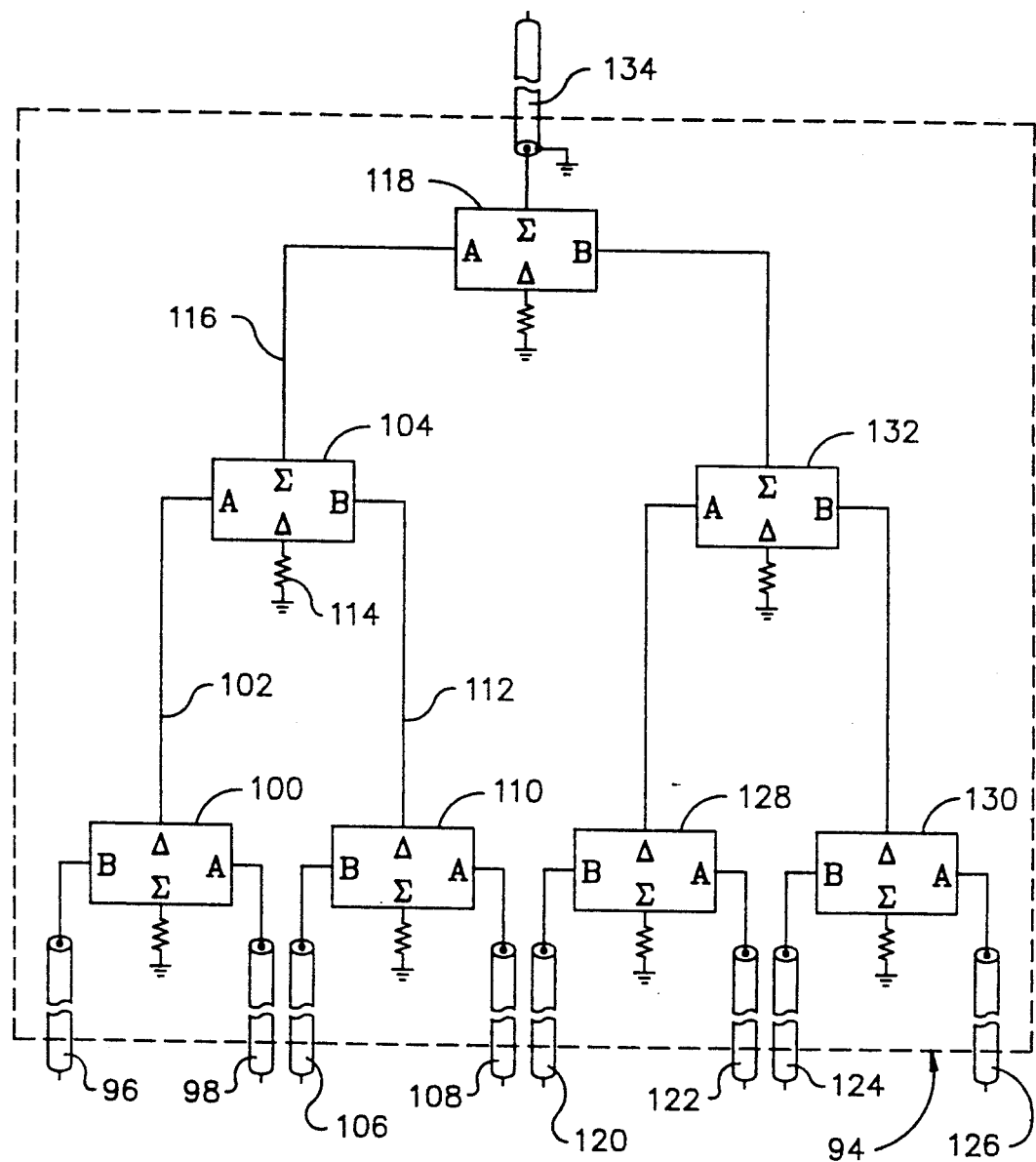
FIG. 4 is a schematic diagram showing the interconnections of a set of four-port hybrid junctions used in one of the magnetic field-sensing portions of the field probe.

The network 94 of FIG. 4 is a network of seven hybrid junctions used to combine eight voltages derived from one of the three loops of the probe into a single output voltage representing the magnetic field vector H for one of the three axes x, y and z. Voltages in the center conductors of coaxial lines 96 and 98 are delivered respectively to the B and A terminals of hybrid junction 100, and the voltage appearing at the Δ terminal represents the difference of the voltages at A and B. If the two voltages at terminals A and B are 180° out of phase, the voltage at the Δ terminal represents the sum of the magnitudes of the two voltages. The Δ terminal of junction 100 is connected through line 102 to the A terminal of another similar junction 104.

Coaxial lines 106 and 108 are similarly connected to the A and B terminals of hybrid junction 110, and the Δ terminal is connected, through line 112 to the B terminal of hybrid junction 104.

Hybrid junction 104 is arranged with its Δ terminal terminated by resistor 114, and with its Σ terminal connected, through line 116, to the A terminal of hybrid junction 118.

Coaxial lines 120, 122, 124 and 126 are similarly connected to a subnetwork comprising junctions 128, 130 and 132, which provides an input to the B terminal of hybrid junction 118. The Σ terminal of junction 118 is connected to a coaxial line 134 from which an output voltage is derived.

In the operation of the network of FIG. 4, the voltage inputs at each pair of coaxial lines, for example 96 and 98, are 180° out of phase with each other. They are effectively added by the first set of hybrid junctions, 100, 110, 128 and 130, so that the Δ terminals of these four junctions provide voltages representing the sums of the magnitudes of the input voltages in each pair.

The outputs of junctions 100, 110, 128 and 130 are in phase. Therefore, hybrid junctions 104 and 132 are arranged with their Δ terminals terminated and outputs are derived from their Σ terminals. Similarly, hybrid junction 118 is arranged with its Δ terminal terminated and its output is derived from its Σ terminal.

The network 94 of FIG. 4 thus combines eight voltages to produce a voltage representing the sum in coaxial line 134.

Figure 5:
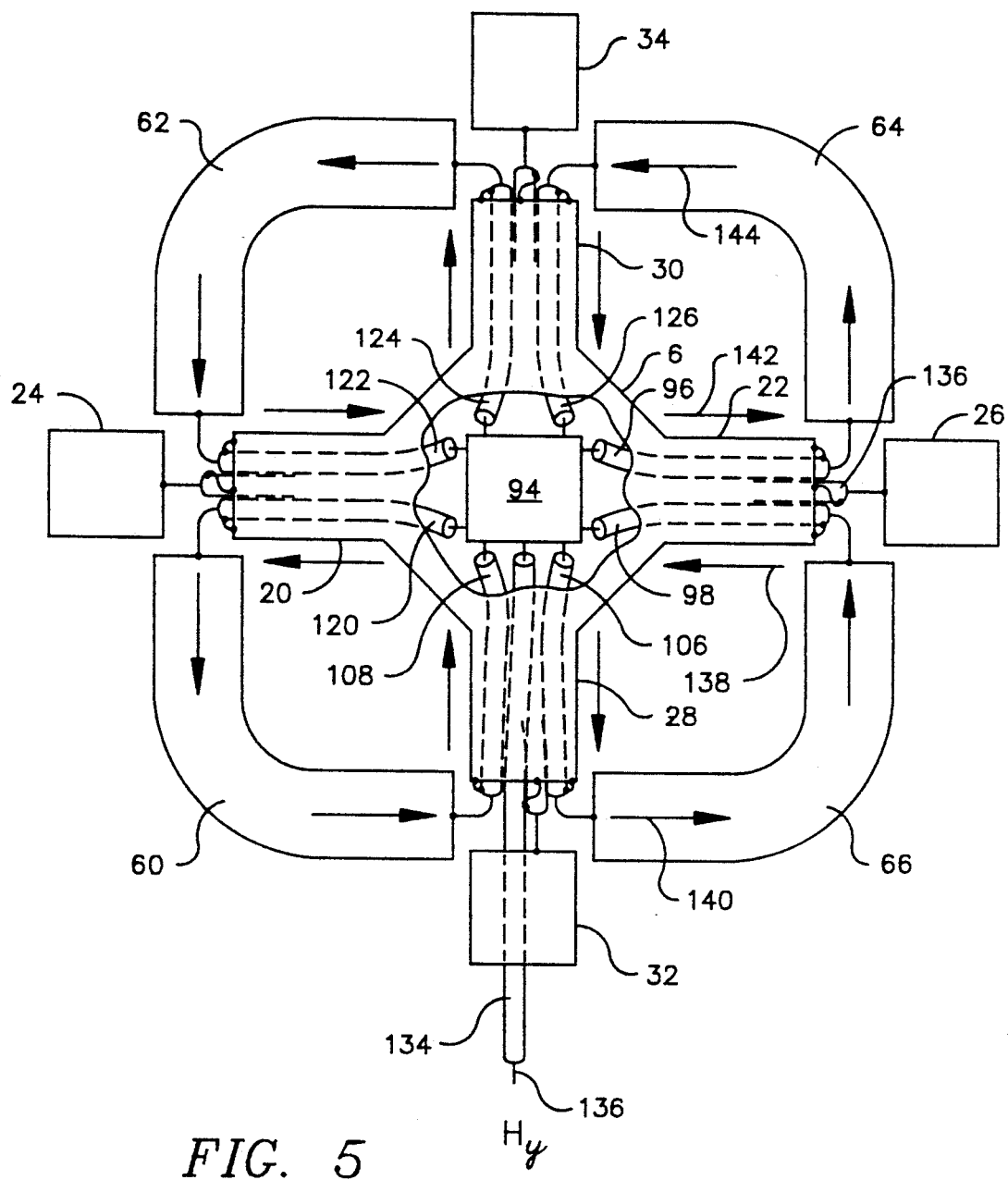
FIG. 5 is a schematic perspective view showing one magnetic field-sensing portion of the field probe and the electrical connections incorporated therein.

FIG. 5 shows the manner in which a network 94 is connected to the elements of the loop in the x-z plane. Network 94 is located within central polyhedron 6, and the coaxial lines extend through the hollow, tubular parts of the central elements of the x-axis and z-axis dipoles, along with the coaxial lines serving those dipoles. For example coaxial lines 96 and 98 extend through tubular part 22 of the x-axis dipole, along with coaxial line 136 (shown only in part), which serves end element 26 of the dipole. The center conductor of coaxial line 96 is connected to one end of loop element 64, and the center conductor of coaxial line 98 is similarly connected to an end of loop element 66.

The other coaxial input lines of network 94 are similarly arranged. Output line 134 extends through tubular element 28 and through end element 32, which is also hollow, to a y-axis magnetic field output terminal 136.

Here also, matching transformers (not shown) can be provided at the loop feed points in order to match the impedances of the loops to the impedances of the hybrid junctions. In a typical implementation, 12.5Ω to 50Ω transformers are used.

At any instant of time, an incident electromagnetic field having a magnetic component in the y-axis will induce a current in the elements of the x-z loop. This current will be unidirectional around the loop, for example in the direction of the arrows in elements 60, 66, 64 and 62 in FIG. 5. Because of this unidirectional current, the voltages in coaxial lines 96 and 98 are 180° out of phase with each other. The voltages in the other pairs of lines, 106 and 108, 120 and 122, and 124 and 126 are similarly 180° out of phase with each other. Network 94, however, adds the magnitudes of all eight of these voltages to provide a voltage at terminal 136 which represents the magnitude of the y-axis magnetic field vector $H_y$.

The structures, electrical connections and operations of the other two loops are similar to those of the x-z loop.

Six outputs, $E_x$, $E_y$, $E_z$, $H_x$, $H_y$ and $H_z$, are provided, representing the electric and magnetic field vectors in all three axes. The magnitudes of these voltages can be measured and processed by computer, using superresolution algorithms, to provide a very accurate measurement of the direction of the incident electromagnetic wave.

Referring again to FIG. 5, it will be apparent that the structure shown comprises not only the loop consisting of elements 60-64, but also four sub-loops, each of which is affected by the magnetic field component in the direction of the y-axis. The arrows adjacent to the tubular parts of the central elements of the dipoles represent currents induced in these elements by the magnetic field component in the direction of the y-axis. For example, arrow 138 represents a current induced in tubular part 22 by the magnetic field enclosed by the sub-loop consisting of elements 66, 22 and 28. Similarly, arrow 142 represents a current induced in tubular part 22 by the magnetic field enclosed by the sub-loop consisting of elements 64, 30 and 22. These magnetically induced currents in tubular part 22 oppose and cancel each other. Similar cancellation takes place in the other parts of the central portion of the probe.

Secondary currents induced in the dipole elements as a result of currents in the loop elements cancel each other in a similar manner.

The balancing of all of these induced currents insures that the electric field measurements are substantially unaffected by the magnetic field components. By deriving eight separate voltages from each loop, a more effective balance is achieved than that achieved by the known field probe in which four voltages are derived from the corners of each loop.

Balancing of the currents induced in the loop elements by electric field components, and by currents in the dipoles, is achieved, as before, by virtue of balancing taking place in the networks which couple the loops to the magnetic field output terminals.

The structure of the probe is also simplified by reason of the fact that electrical connections are made to the loop at the locations at which the loop crosses the x, y and z axes. It is no longer necessary to run coaxial lines through the interiors of the elements of the loop.

Various modifications can be made to the field probe as described above. For example, while the loop configurations shown are in the form of rectangles with rounded corners, the loops can have other shapes. For example, the probe can have circular loops, each comprising four quarter-circular elements. Whereas the central element 6 is preferably a tetradecahedron having six rectangular faces and eight triangular faces, as shown, the central element can have a spherical shape, or any other shape which is substantially symmetrical. While a four-port hybrid junction, such as the one shown in FIG. 2 is preferred as a building block for the networks used to connect the elements to the output ports at least at low frequencies, many other implementations of four-port hybrid junctions are well known and can be used. For example, at higher frequencies, four-port hybrid junctions utilizing transmission lines rather than lumped elements can be used. In addition, in the networks, instead of four-port hybrid junctions, alternative circuits such as baluns, or combinations of baluns and T-junctions, can be used. Other modifications can be made to the field probe as described herein without departing from the scope of the invention as defined in the following claims.

I claim:

1. A vector field probe comprising:
   a set of three loops having a common center and situated respectively in three mutually orthogonal planes, each of said planes being defined by a different pair of mutually perpendicular axes extending through said common center;
   in which:
   each loop comprises four conducting elements each extending from a point adjacent to one of said axes to a point adjacent to another of said axes, and said conducting elements of each loop are separated from one another by gaps;
   and having
   three magnetic field output ports, there being one such output port corresponding to each loop; and
   means, for each loop, connected to the loop at the gaps thereof, and coupling loop to the corresponding output port;
   and in which the gaps of the loops are located on said axes, whereby each gap of each loop coincides with a gap of one of the other two loops, the gaps exist at only six locations, and the connections of said coupling means to said loops are made only at the six locations of said gaps.

2. A vector field probe according to claim 1 in which said means, for each loop, connected to the loop at the gaps thereof and coupling the loop to the corresponding output port, comprises an additive network for each loop, each said additive network being connected to the loop elements of its corresponding loop at the locations of the gaps therein.

3. A vector field probe according to claim 1 in which said means, for each loop, connected to the loop at the gaps thereof and coupling the loop to the corresponding output port, comprises and additive network for each loop, each said additive network having eight input ports and one output port.

4. A vector field probe according to claim 1 in which said means, for each loop, connected to the loop at the gaps thereof and coupling the loop to the corresponding output port, comprises an additive network for each loop, each said additive network having four pairs of input ports and one output port, and in which each said additive network includes, for each pair of its input ports, means for shifting a signal at one port of the pair by 180° and combining the shifted signal with a signal at the other port of the pair.

5. A vector field probe according to claim 1 in which said means, for each loop, connected to the loop at the gaps thereof and coupling the loop to the corresponding output port, comprises an additive network for each loop, the additive network for each loop comprising seven four-port hybrid junctions and having eight input ports and one output port.

6. A vector field probe according to claim 1 in which said means, for each loop, connected to the loop at the gaps thereof and coupling the loop to the corresponding output port, comprises an additive network for each loop, each said additive network comprising seven four-port hybrid junctions and having eight input ports and one output port, and in which each input port of each said additive network is connected to a different end of a conducting element of its corresponding loop.

7. An electromagnetically complete vector field probe comprising:
- a set of three dipoles extending respectively along mutually perpendicular axes; and
- a set of three loops situated respectively in three mutually orthogonal planes, each of said planes being defined by a different pair of said axes;

in which:
- said dipoles and loops all have a common center so that each dipole extends in perpendicular relation to the plane of a different one of said loops, and through the center thereof;
- each dipole comprises a central conducting element extending through said common center, and two end conductors, one at each end of said central conducting element, each end conductor being separated from said central conducting element by a gap; and
- each loop comprises four conducting elements each extending from a point adjacent to one of said axes to a point adjacent to another of said axes, said conducting elements of each loop are separated from one another by gaps at said axes, each gap of each loop coincides with a gap of one of the other two loops so that the gaps of the loops are situated at only six locations;

whereby the vector components of an incident electromagnetic field can be separately measured, and whereby electrical connections can be made to the loops at the six locations of the gaps of said loops.

8. An electromagnetically complete vector field probe according to claim 7 in which each gap of each loop is also coincident with a gap of one of said dipoles whereby electrical connections to said dipoles can also be made at said six locations.

9. An electromagnetically complete vector field probe according to claim 7 further comprising a set of three electric field output ports; a set of three magnetic field output ports; means for connecting each one of said three dipoles to a different one of said three electric field output ports; and means for connecting each one of said three loops to a different one of said three magnetic field output ports.

10. An electromagnetically complete vector field probe according to claim 9 in which said means for connecting each one of said three loops to a different one of said three magnetic field output ports comprises an additive network for each loop, each said additive network being connected to the loop elements of its corresponding loop at the locations of the gaps therein.

11. An electromagnetically complete vector field probe according to claim 9 in which said means for connecting each one of said three loops to a different one of said three magnetic field output ports comprises an additive network for each loop, each said additive network having eight input ports and one output port.

12. An electromagnetically complete vector field probe according to claim 9 in which said means for connecting each one of said three loops to a different one of said three magnetic field output ports comprises an additive network for each loop, each said additive network having four pairs of input ports and one output port, and in which each said additive network includes, for each pair of its input ports, means for shifting a signal at one port of the pair by 180° and combining the shifted signal with a signal at the other port of the pair.

13. An electromagnetically complete vector field probe according to claim 9 in which said means for connecting each one of said three loops to a different one of said three magnetic field output ports comprises an additive network for each loop, the additive network for each loop comprising seven four-port hybrid junctions and having eight input ports and one output port.

14. An electromagnetically complete vector field probe according to claim 9 in which said means for connecting each one of said three loops to a different one of said three magnetic field output ports comprises an additive network for each loop, each said additive network comprising seven four-port hybrid junctions and having eight input ports and one output port, and in which each input port of each said additive network is connected to a different end of a conducting element of its corresponding loop.

15. An electromagnetically complete vector field probe according to claim 9 in which said three dipoles have a common central conducting element, and said means for connecting each one of said three loops to a different one of said three magnetic field output ports comprises an additive network for each loop, each additive network having eight coaxial input ports and one output port, and in which each coaxial input port has a center conductor connected to a different end of a conducting element of its corresponding loop and an outer conductor connected to said common central conducting element.

16. An electromagnetically complete vector field probe according to claim 9 in which said three dipoles have a common central conducting element, and said means for connecting each one of said three loops to a different one of said three magnetic field output ports comprises an additive network for each loop, each additive network comprising seven four-port hybrid junctions and having eight coaxial input ports and one output port, and in which each coaxial input port has a center conductor connected to a different end of a conducting element of its corresponding loop and an outer conductor connected to said common central conducting element.

17. An electromagnetically complete vector field probe according to claim 8 further comprising a set of three electric field output ports; a set of three magnetic field output ports; means connected to each of said three dipoles, at the locations of the gaps therein, for coupling each one of said dipoles to a different one of said three electric field output ports; and means connected to each of said three loops, at the locations of the gaps therein, for connecting each one of said three loops to a different one of said three magnetic field output ports; whereby all of the electrical connections to the loops and to the dipoles are made at said six locations.

* * * * *